United States Patent
Lee et al.

(10) Patent No.: US 6,482,662 B1
(45) Date of Patent: Nov. 19, 2002

(54) SEMICONDUCTOR DEVICE FABRICATING METHOD

(75) Inventors: Soo-Cheol Lee, Seoul (KR); Jong-Hyon Ahn, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/546,527

(22) Filed: Apr. 10, 2000

(30) Foreign Application Priority Data

Oct. 18, 1999 (KR) .......................................... 99-45012

(51) Int. Cl.⁷ ............................................. H01L 21/66
(52) U.S. Cl. ........................ 438/14; 438/16; 438/293; 438/945
(58) Field of Search ............................. 438/14, 16, 17, 438/197, 257, 283, 669, 671, 942, 943, 945

(56) References Cited

U.S. PATENT DOCUMENTS

| | | | |
|---|---|---|---|
| 5,437,947 A | * 8/1995 | Hur et al. | ................. 430/322 |
| 5,655,110 A | * 8/1997 | Krivokapic et al. | ........ 700/95 |
| 5,863,824 A | 1/1999 | Gardner et al. | |
| 5,907,169 A | * 5/1999 | Hshieh et al. | ............ 257/262 |
| 6,083,272 A | * 7/2000 | Nistler et al. | ............... 438/18 |
| 6,218,089 B1 | * 4/2001 | Pierrat | ........................ 430/312 |
| 6,232,189 B1 | * 5/2001 | Yi et al. | ..................... 428/291 |

* cited by examiner

Primary Examiner—Kevin M. Picardat
(74) Attorney, Agent, or Firm—Volentine Francos, PLLC

(57) ABSTRACT

A method of fabricating a semiconductor device is provided that includes forming first and second gate electrodes on a substrate via a first photo mask, in which the first and second gate electrodes are in a longitudinal direction parallel to respective channels arranged in x-axis y-axis directions, measuring and comparing the lengths of the first and second gate electrodes on the substrate, estimating a mask bias on the basis of the difference between the actually measured lengths of the gate electrodes, and forming patterns of the first and second gate electrodes of which lengths are adjusted with the estimated mask bias on a new second photo mask, so that the first and second gate electrodes of the same length are formed on the same substrate via the new, second photo mask, regardless of the arrangement directions of the gate electrodes in parallel to channels. This has the effect of improving the processing speed of high CPU or logic element and the yield of products manufactured by this process.

16 Claims, 2 Drawing Sheets

SEMICONDUCTOR DEVICE FABRICATING METHOD

This application relies for priority upon Korean Patent Application No. 99-45012, filed on Oct. 18, 1999, the contents of which are herein incorporated by reference in their entirety.

BACKGROUND OF THE INVENTION

The present invention relates to a method for fabricating a semiconductor device. More particularly, the present invention relates to a method for fabricating a semiconductor device where variations in a gate critical dimension (hereinafter referred to as gate CD) are reduced, regardless of the arrangement directions of gate electrodes in transistors of one chip.

In general, the size of a semiconductor device decreases as the degree of integration increases, particularly when the degree of integration relates to an integrated circuit in which the gate CD of gate electrodes has also been reduced. Accordingly, as it is highly probable that there may be variations in the length of the gate electrodes in even one chip, it becomes more and more important to make the channel length of the gate electrodes exactly equal.

FIG. 1 shows exemplary views of gate electrodes in a general semiconductor device. As shown in FIG. 1, a first gate electrode 11 is generally formed having a length $L_1$ along an x-axis in longitudinal direction parallel to a channel. Similarly, a second gate electrode 12 is generally formed having a length $L_2$ along a y-axis in a longitudinal direction parallel to another channel on the same chip substrate 10. Furthermore, although only one example is presented for each of the first and second gate electrodes 11 and 12 in FIG. 1, it should be taken for granted that larger numbers of the first and second gate electrodes 11 and 12 are actually formed on the same chip.

In order to make the gate lengths $L_1$, $L_2$ equal on the same substrate 10, identical size of patterns should be formed for the first and second gate electrodes 11 and 12 on a photo mask (not shown) used to create the gate electrodes 11 and 12. However, if the gate lengths $L_1$, $L_2$ are reduced below about 0.2 µm, there may be variations in the gate CD of the first and second gate electrodes 11 and 12 formed on the same substrate 10. This may happen because there is a skew between the first and second gate electrodes made by parameters such as the mask, the photo scanning direction, or the directional characteristics of the etching process involved in the formation of the gate electrodes.

If such variations are not adjusted, the gate CD of the first and second gate electrodes respectively having the gate lengths $L_1$, $L_2$ on the same chip may be divided into two values of $L_{11}$ and $L_{12}$ as in the normal distribution curves shown in FIG. 2. As FIG. 2 shows, the distribution for $L_{12}$ indicates higher values for the gate length $L_{12}$ than for gate length $L_{11}$.

In particular, the reference letters $L_1$, and $L_2$ represent target values or set values in the gate length, while reference letters $L_{11}$ and $L_{12}$ represent the central value or representative value in the gate CD measured.

In other words, if the gate CD of the gate length $L_1$ is regarded as a desired value, the gate CD of the gate length $L_2$ is larger than the desired value. On the other hand, if the gate CD of the gate length $L_2$ is regarded as a desired value, the gate CD of the gate length $L_1$ is smaller than the desired value. Regardless, there may be false operational effects of transistors because the gate CD of one of the gate lengths is larger or smaller than the desired value.

This is particularly important in a sub-quarter micron semiconductor device like a high speed CPU or a logic element, since a minimum variation in the gate CD of the gate lengths may result in significant deterioration in both the performance and yield of such semiconductor device products.

For instance, if the gate CD is larger than the desired value, then the effective channel length of gate electrodes increases, the threshold voltage $V_{th}$ of the related transistor increases, the drain saturation current of the transistor decreases, and the drive-in current of the transistor decreases. Such changes result in a loss of the transistor properties and a reduction in the operational speed of the high speed CPU or the logic element that make up the relevant device.

On the other hand, if the gate CD is smaller than the desired value, the threshold voltage of the related transistor decreases, the drain saturation current of the transistor increases, the current leakage, i.e., the OFF current, of the transistor increases, and the breakdown voltage of the transistor decreases. Such changes result in operational failures and, even worse, a reduction in the yield of a semiconductor device such as a high speed CPU or logic element.

At present, a variety of methods have been developed to minimize the variations in the gate CD of the gate length of gate electrodes on the same chip, such as inducing a change in the gate electrode forming material, making a hard mask onto the gate electrodes, changing the type or thickness of a photo resist layer, making a change in the conditions of an etching process used to form gate electrodes, and adding a side optical proximity correlation depending on the pattern density of the gate electrodes, i.e., using a so-called photo mask process.

Specifically, the method of causing a change in the material for making gate electrodes includes changing a condition for making a deposition structure of a polysilicon layer. As a result, gate electrodes are formed of different particle sizes as compared to the polysilicon layer. This can smooth the morphology of particles of the polysilicon layer and reduce the thickness of the polysilicon layer.

The method of making a hard mask onto the gate electrodes includes depositing a hard mask, such as a thin oxide or nitride layer, on the polysilicon layer, selectively etching the hard mask with a pattern of a photo resist layer, and finally forming gate electrodes by further etching the polysilicon layer with a remaining hard mask.

In the method of making a change in the type of the photo resist layer, a negative or positive photo resist layer is used to increase or decrease the resistance of the photo resist layer, or to reduce the thickness of the photo resist layer.

The method of changing conditions in the process of etching the gate electrodes includes, for example, changing the conditions for performing a selective etching process of the polysilicon layer.

On the other hand, since the variations in the gate CD of gate electrodes are significantly different depending on the pattern density, there is also another conventional method, a so-called selective biasing method, in which a selective biasing process is performed depending on the pattern density. However, there is a disadvantage in the selective biasing method in that the variations in the gate CD of gate electrodes cannot be adjusted due to some directional characteristics of the pattern arrangements.

SUMMARY OF THE INVENTION

Therefore, it is an object of the present invention to provide a method for fabricating a semiconductor memory device by which variations in gate CD of gate electrodes decrease regardless of the arrangement directions of the gate electrodes.

In order to accomplish the aforementioned object of the present invention, a method is provided for fabricating a semiconductor device. This method includes forming original first and second gate electrodes on a substrate in longitudinal directions parallel to first and second channels in different arrangement directions, measuring first and second lengths of the first and second original gate electrodes, respectively, forming an adjusted photo mask, the adjusted photo mask having adjusted patterns patterns corresponding to the first and second original gate electrodes, adjusted on the basis of the measured first and second lengths, and forming adjusted first and second gate electrodes on the substrate via the adjusted photo mask.

The forming of the adjusted photo mask may further comprise comparing the measured first and second lengths, and estimating a mask bias on the basis of the difference between the first and second lengths. The measured first and second lengths may be compared with a desired value. This desired value may be the second length.

The adjusted photo mask is preferably formed to reduce the length of the adjusted first gate electrode if the length of the original first gate electrode is larger than a desired value. Similarly, the adjusted photo mask is preferably formed to increase the length of the adjusted first gate electrode if the length of the original first gate electrode is smaller than a desired value.

The length of the adjusted first and second gate electrodes can be varied by using a push bias process, a phase shift process, or the like.

The adjusted photo mask may be formed by increasing the length of a selected one of the original first and second gate electrodes formed via an original photo mask if the length of the selected gate electrode is smaller than a desired value.

The length of the selected gate electrode can be varied by using a push bias process or a phase shift process. The first and second gate electrodes preferably comprise a polysilicon layer. In addition, the adjusted first and second gate electrodes have substantially the same length.

As a result of this, gate electrodes having an identical gate CD can be formed on the same substrate regardless of the different arrangement directions of the gate electrodes in parallel to channels.

BRIEF DESCRIPTION OF THE DRAWINGS

Objects and aspects of the invention will become apparent from the description of an embodiment with reference to the accompanying drawings in which.

DETAILED DESCRIPTION OF THE PREFERRED EMBODIMENT

Figure 1:
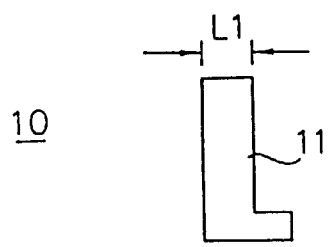
FIG. 1 shows exemplary views of gate electrodes in a conventional semiconductor device.
Figure 1:
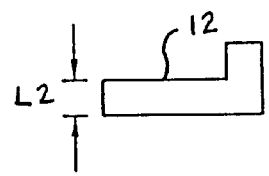
Figure 2:
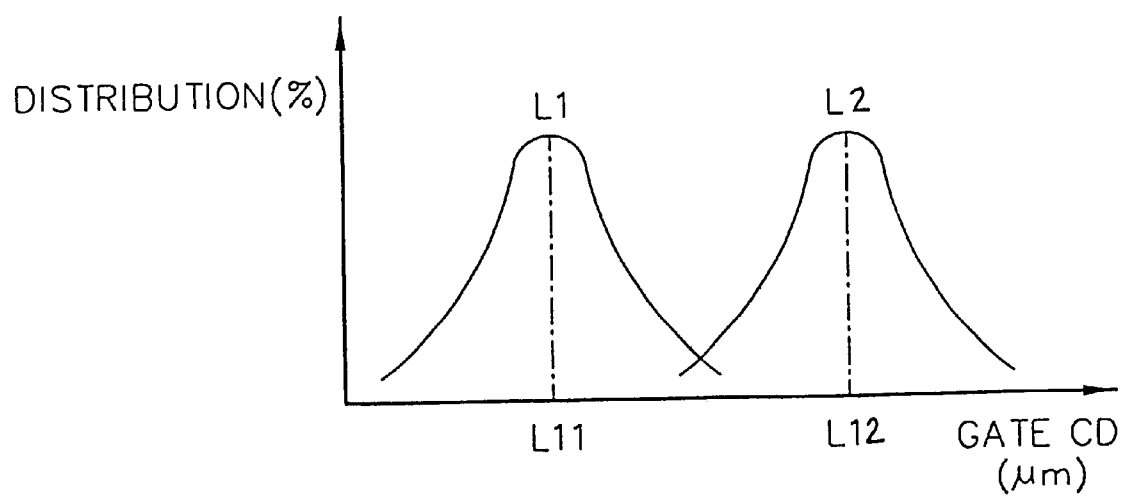
FIG. 2 shows gate critical dimension distribution curves of gate electrodes having different arrangement directions in accordance with a conventional semiconductor device.

A method for fabricating a semiconductor device of the present invention will be described below with reference to accompanying drawings. Reference numerals and symbols that designate the same parts and functions of the conventional designs will be used to refer to the same parts and functions of the present invention.

Figure 3:
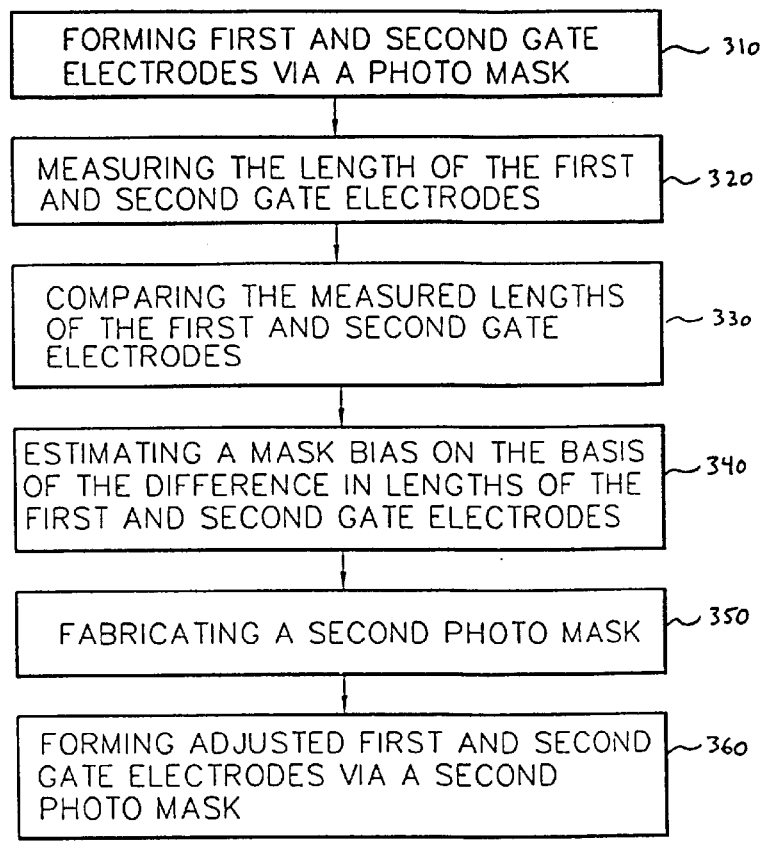
FIG. 3 is a flowchart showing how to reduce variations in gate critical dimension of gate electrodes having different arrangement directions in a semiconductor device in accordance with a preferred embodiment of the present invention.
Figure 4:
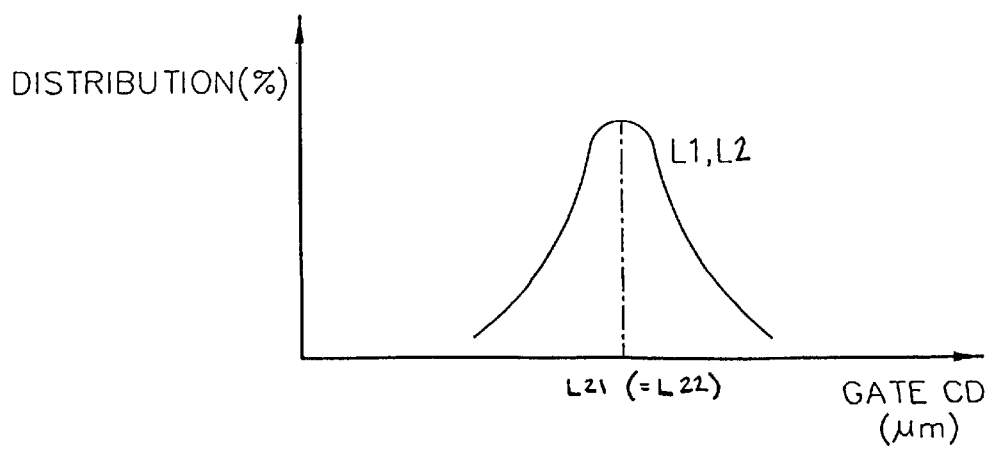
FIG. 4 is a gate critical dimension distribution curve of gate electrodes having different arrangement directions in accordance with a preferred embodiment of the present invention.

FIG. 3 is a flowchart showing how to reduce gate CD variations in the channel length of gate electrodes using a method for fabricating a semiconductor device according to a preferred embodiment of the present invention.

As shown in FIG. 3, the method starts by forming first and second gate electrodes via a photo mask (Step 310). To accomplish this, an isolation layer is formed on a field zone of a substrate 10 (not shown) through an isolation process such as a local oxidation of silicon (LOCOS) process or a shallow trench isolation (STI) process to define an active zone of the substrate 10. (See FIG. 1) Then, the isolation layer is used as a mask for growing a gate insulating layer (not shown) at an active zone of the substrate 10 through a thermal oxidation process.

After a conductivity layer used for the gate electrodes, e.g., a polysilicon layer, is deposited over the gate insulating layer, an unadjusted first photo-mask is used for a photo etching process, to eliminate unnecessary part of the polysilicon layer. As a result of this, first and second gate electrodes 11 and 12 are formed. The first gate electrode 11 has a gate length $L_1$ in an x-axis direction parallel to a first channel; and the second gate electrode 12 has a gate length $L_2$ along a y-axis direction in parallel to a second channel.

It should be noted that even though if only one example is presented for the first and second gate electrodes 11 and 12 in FIG. 1, this does not limit the invention to such an embodiment. It should be taken for granted that a plurality of first and second gate electrodes 11 and 12 are actually formed on the same chip.

After the first and second gate electrodes 11 and 12 are formed, the lengths $L_1$, $L_2$ of the first and second gate electrodes 11 and 12 are respectively measured, preferably with a scanning electron microscope (Step 320). At this time, the length of the gate electrodes can be measured in an in-situ state after the complete formation of the gate electrodes. In the alternative, the substrate could be transferred to a separate measurement station for measurement of the lengths $L_1$, $L_2$.

At this time, the length of only one gate electrode on the same substrate may be measured because the value obtained by an actual measurement reflects relative variations in the gate CD of gate electrodes from a desired value required for all of the first and second gate electrodes 11 and 12. However, the length of all of the gate electrodes required for the substrate may be also measured. Furthermore, the length of all of the gate electrodes in only one substrate from a fabricating batch may be measured because the value obtained through the actual measurement reflects relative variations in the gate CD of the gate electrodes from a desired value required for all the substrates of the same fabricating batch.

After measurement of the gate electrodes 11 and 12, the lengths $L_1$, $L_2$ of the gate electrodes are compared (Step 330). There is usually a difference between the two measured values because of a skew between the first and second gate electrodes 11 and 12 made by the mask, photo scanning direction, or directional characteristics of the etching process, which may have been involved in forming the gate electrodes 11 and 12.

After comparing the lengths of the gate electrodes 11 and 12, a mask bias is estimated on the basis of the difference in the actually-measured lengths of the gate electrodes 11 and 12 (Step 340). The determined mask bias makes it possible to confirm variations in the gate lengths from the desired value required for all of the gate electrodes.

After the estimation of the mask bias, an adjusted photo mask (not shown) is fabricated using the estimated mask bias as a correction factor (Step 350). In other words, consider the case where the gate CD of the gate length $L_1$ measured in step 320 is the same as the desired value, and the gate CD of the gate length $L_2$ measured in step 320 is larger than the desired value. In order to achieve an identical value for gate CD of the lengths $L_1$ and $L_2$ of the first and second gate electrodes 11 and 12, the gate CD of the second gate electrode 12 (related to the gate length $L_2$) is reduced on the adjusted photo mask. However, the gate CD of the first gate electrode 11 (related to the gate length $L_1$) is kept the same on the adjusted photo mask.

For example, if the electron beam needs to be injected 10 times without overlap to form the length of the gate electrode relevant to the length $L_1$ of the gate electrode 11 as it is on the photo mask, it is necessary to inject the electron beam 10 times with a predetermined size of overlap between specific adjacent electron beam injected spots to form a reduced length of the gate electrode relevant to that $L_2$ of the gate electrode 12 on the photo mask. In other words, a reticle patterning process is performed.

Likewise, if the gate CD of the measured gate length $L_2$ is the same as the desired value and the gate CD of the measured gate length $L_1$ is larger than the desired value, an analogous process should be performed. A detailed description of this process will be omitted to avoid repetition.

In contrast, consider the case where the gate CD of the measured gate length $L_1$ is the same as the desired value and the gate CD, and the measured gate length $L_2$ is smaller than the desired value. In order to achieve an identical value for gate CD of the lengths $L_1$ and $L_2$ of the first and second gate electrodes 11 and 12, a gate CD of the length of the second gate electrode (corresponding to the gate length $L_2$) should be increased on the second photo mask.

This means that if the electron beam needs to be injected 10 times without overlap to form the length of the gate electrode relevant to $L_1$ of the gate electrode 11 as it is on the photo mask, it is necessary to inject an electron beam 10 times in a predetermined size of overlap between specific adjacent electron beam injected spots to form an increased length of the gate electrode relevant to that $L_2$ of the gate electrode 12 on the photo mask. Once more, this describes a reticle patterning process.

Likewise, if the gate CD of the measured gate length $L_2$ is the same as the desired value and the gate CD of the measured gate length $L_1$ is larger than the desired value, an analogous process can be performed. A detailed description of such process will be omitted to avoid repetitions.

If the difference in the gate CD of the lengths $L_1$ and $L_2$ of the gate electrodes is smaller than one spot, i.e., a minimum size of an electron beam on the mask, a push bias or phase shift process is followed. If the difference in the gate CD of the lengths $L_1$ and $L_2$ of the gate electrodes is larger than one spot, i.e., a minimum size of an electron beam onto the mask, one or more spots will be adjusted in the process of injecting electron beam.

If the second photo mask is fabricated, a polysilicon layer is preferably deposited over the gate insulating layer for forming adjusted first and second gate electrodes 11*a* and 12*a* after completely eliminating the first and second gate electrodes 11 and 12 that had been previously formed on the gate oxide layer. Then, a photo etching process is performed with the second photo mask, to form the first and second gate electrodes 11*a*, 12*a*. At this time, the gate CD of the first and second gate electrodes that had gate lengths $L_1$ and $L_2$ are set with gate lengths $L_{21}$ and $L_{22}$ that are equal to the desired value, i.e., ($L_{21}=L_{22}$).

Therefore, in the present invention, the first and second gate electrodes are formed on the substrate to have the same length, regardless of the arrangement directions of the gate electrodes, thereby improving the processing speed of high CPU or logic elements and the yield of products fabricated with this method.

As described above, the method of fabricating the semiconductor device in accordance with the present invention includes forming the first and second gate electrodes on the substrate via the first photo mask in which the first and second gate electrodes are in longitudinal direction parallel to respective channels arranged in x-axis and y-axis directions, measuring and comparing the lengths of the first and second gate electrodes on the substrate, estimating a mask bias on the basis of the difference between the actually measured lengths of the gate electrodes, and forming patterns of the first and second gate electrodes of which the lengths are adjusted with the estimated mask bias on a new second photo mask.

As a result, this method enjoys advantages for fabricating semiconductor devices in that first and second gate electrodes having the same length are formed on the same substrate via the new, second photo mask, regardless of the arrangement directions of the gate electrodes in parallel to various channels. This has the effect of improving the processing speed of high CPU or logic element and the yield of products made using this technique.

Having described a specific preferred embodiment of the invention, it is to be understood that the invention is not limited to this precise embodiment, and that various changes and modifications may be effected by one skilled in the art without departing from the scope or spirit of the invention as defined in the appended claims.

What is claimed is:

1. A method for fabricating a semiconductor device, comprising:

forming original first and second gate electrodes on a substrate in longitudinal directions parallel to first and second channels in different arrangement directions;

measuring first and second lengths of the first and second original gate electrodes, respectively;

forming an adjusted photo mask, the adjusted photo mask having adjusted patterns corresponding to the first and second original gate electrodes, adjusted on the basis of the measured first and second lengths; and forming adjusted first and second gate electrodes on the substrate via the adjusted photo mask.

2. A method for fabricating a semiconductor device, as recited in claim 1, wherein the forming of the adjusted photo mask further comprises:

comparing the measured first and second lengths; and estimating a mask bias on the basis of the difference between the first and second lengths.

3. A method for fabricating a semiconductor device, as recited in claim 2, wherein the measured first and second lengths are compared with a desired value.

4. A method for fabricating a semiconductor device, as recited in claim 1, wherein the adjusted photo mask is formed to reduce the length of the adjusted first gate electrode if the length of the original first gate electrode is larger than a desired value.

5. A method for fabricating a semiconductor device, as recited in claim 4, wherein the length of the adjusted first and second gate electrodes can be varied by using a push bias process.

6. A method for fabricating a semiconductor device, as recited in claim 4, wherein the length of the adjusted first and second gate electrodes can be varied by using a phase shift process.

7. A method for fabricating a semiconductor device, as recited in claim 4, wherein the desired value is the second length.

8. A method for fabricating a semiconductor device, as recited in claim 1, wherein the adjusted photo mask is formed to increase the length of the adjusted first gate electrode if the length of the original first gate electrode is smaller than a desired value.

9. A method for fabricating a semiconductor device, as recited in claim 8, wherein the length of the adjusted first and second gate electrodes can be varied by using a push bias process.

10. A method for fabricating a semiconductor device, as recited in claim 8, wherein the length of the adjusted first and second gate electrodes can be varied by using a phase shift process.

11. A method for fabricating a semiconductor device, as recited in claim 8, wherein the desired value is the second length.

12. A method for fabricating a semiconductor device, as recited in claim 1, wherein the adjusted photo mask is formed by increasing the length of a selected one of the original first and second gate electrodes formed via an original photo mask if the length of the selected gate electrode is smaller than a desired value.

13. A method for fabricating a semiconductor device, as recited in claim 12, wherein the length of the selected gate electrode can be varied by using a push bias process.

14. A method for fabricating a semiconductor device, as recited in claim 12, wherein the length of the selected gate electrode can be varied by using a phase shift process.

15. A method for fabricating a semiconductor device, as recited in claim 1, wherein the first and second gate electrodes comprise a polysilicon layer.

16. A method for fabricating a semiconductor device, as recited in claim 1, wherein the adjusted first and second gate electrodes have substantially the same length.

* * * * *